(12) United States Patent
Ganga et al.

(10) Patent No.: US 8,370,704 B2
(45) Date of Patent: Feb. 5, 2013

(54) CABLE INTERCONNECTION TECHNIQUES

(75) Inventors: Ilango S. Ganga, Cupertino, CA (US);
Richard I. Mellitz, Prosperity, SC (US)

(73) Assignee: Intel Corporation, Santa Clara, CA (US)

( * ) Notice: Subject to any disclaimer, the term of this patent is extended or adjusted under 35 U.S.C. 154(b) by 956 days.

(21) Appl. No.: 12/381,194

(22) Filed: Mar. 9, 2009

(65) Prior Publication Data

US 2010/0229067 A1   Sep. 9, 2010

(51) Int. Cl.
*H03M 13/00* (2006.01)
(52) U.S. Cl. .................................. 714/757; 714/775
(58) Field of Classification Search .................. 714/752, 714/757, 775
See application file for complete search history.

(56) References Cited

U.S. PATENT DOCUMENTS

| | | | |
|---|---|---|---|
| 4,860,283 A | 8/1989 | Takano et al. |
| 5,491,565 A | 2/1996 | Naper |
| 5,627,836 A | 5/1997 | Conoscenti et al. |
| 5,805,597 A | 9/1998 | Edem |
| 5,889,776 A | 3/1999 | Liang |
| 5,907,553 A | 5/1999 | Kelly et al. |
| 5,930,015 A | 7/1999 | Yamamoto et al. |
| 6,169,729 B1 | 1/2001 | Feuerstraeter |
| 6,198,727 B1 | 3/2001 | Wakeley et al. |
| 6,201,654 B1 | 3/2001 | Okamoto et al. |
| 6,215,184 B1 | 4/2001 | Stearns et al. |
| 6,215,816 B1 | 4/2001 | Gillespie et al. |
| 6,222,852 B1 | 4/2001 | Gandy |
| 6,345,345 B1 | 2/2002 | Yu et al. |
| 6,349,331 B1 | 2/2002 | Andra et al. |
| 6,359,893 B1 | 3/2002 | Mills |
| 7,284,184 B2 | 10/2007 | Gallezot et al. |
| 7,343,540 B2 | 3/2008 | Khermosh et al. |
| 7,499,500 B2 | 3/2009 | Page |
| 7,835,389 B2 | 11/2010 | Yu et al. |
| 2001/0009533 A1 | 7/2001 | Baroche |
| 2001/0009553 A1 | 7/2001 | Homann |
| 2001/0034729 A1 | 10/2001 | Azadet et al. |
| 2002/0091884 A1 | 7/2002 | Chang et al. |
| 2002/0123365 A1 | 9/2002 | Thorson et al. |
| 2004/0001579 A1 | 1/2004 | Feinberg et al. |

(Continued)

FOREIGN PATENT DOCUMENTS

| JP | 10-304004 A | 11/1998 |
|---|---|---|
| JP | 2003087261 A | 3/2003 |

(Continued)

OTHER PUBLICATIONS

Ganga, Ilango; Intel; "Considerations for 40G Backplane Ethernet PHY"; IEEE 802.3 Higher Speed Study Group, Sep. 2007 Interim, Seoul; Sep. 12, 2007; pp. 1-11.*

(Continued)

*Primary Examiner* — Joshua Lohn
(74) *Attorney, Agent, or Firm* — Glen B. Choi (57) ABSTRACT

Techniques are described that can extend the transmission rate over cable. Multiple cables can be used to increase the transmission rate. The transmission standard applied for each cable can be an Ethernet backplane standard such as IEEE 802.3ap (2007). Data can be assigned to virtual lanes prior to transmission over a cable. Forward error correction may be applied to each virtual lane prior to transmission over cable. Forward error correction may be negotiated over a single virtual lane and then applied to all virtual lanes.

19 Claims, 10 Drawing Sheets

U.S. PATENT DOCUMENTS

| | | | |
|---|---|---|---|
| 2004/0091027 | A1 | 5/2004 | Booth et al. |
| 2004/0233981 | A1 | 11/2004 | Porter et al. |
| 2004/0247313 | A1 | 12/2004 | Tanaka |
| 2005/0111531 | A1 | 5/2005 | Booth et al. |
| 2005/0149822 | A1 | 7/2005 | Lee et al. |
| 2006/0098686 | A1 | 5/2006 | Takakuwa et al. |
| 2007/0157060 | A1 | 7/2007 | Ganga et al. |
| 2008/0244100 | A1 | 10/2008 | Uddenberg et al. |
| 2009/0219978 | A1 | 9/2009 | Mobin et al. |

FOREIGN PATENT DOCUMENTS

| | | |
|---|---|---|
| JP | 2003087276 A | 3/2003 |
| TW | I236237 | 7/2005 |
| WO | 0147184 A2 | 6/2001 |
| WO | 2004004518 A1 | 1/2004 |
| WO | 2005091569 A1 | 9/2005 |

OTHER PUBLICATIONS

Szczepanek et al.; "10GBASE-KR FEC Tutorial"; IEEE 802 Plenary Jul. 2006; pp. 1-87.*

Hankins, Greg; "IEEE P802.3ba 40 GbE and 100 GbE Standards Update"; NANOG 44; Oct. 13, 2008; p. 1-24.*

"IEEE Draft P802.3ap/Draft 3.0"; Jul. 25, 2009; pp. 162-183.*

Office Action received for U.S. Appl. No. 10/291,017, mailed May 9, 2006, 23 pages.

Office Action received for U.S. Appl. No. 10/291,017, mailed Aug. 4, 2008, 22 pages.

Office Action received for U.S. Appl. No. 10/291,017, mailed Nov. 1, 2006, 19 pages.

Office Action received for U.S. Appl. No. 10/291,017, mailed Feb. 3, 2009, 25 pages.

Office Action received for U.S. Appl. No. 10/801,504, mailed May 29, 2007, 24 pages.

Office Action received for U.S. Appl. No. 10/801,504, mailed Mar. 31, 2008, 19 pages.

Office Action received for U.S. Appl. No. 10/801,504, mailed Dec. 11, 2007, 18 pages.

Office Action received for U.S. Appl. No. 10/801,504, mailed Dec. 9, 2008, 25 pages.

Richard Mellitz, "40 GbE Over 4-lane 802.3ap Compliant Backplane", IEEE 802.3 HSSG, Nov. 2007, 11 pages.

Richard Mellitz, "IEEE 802.3ap (or 10GBASE-KR) Jitter Spec is Inclusive of Package Crosstalk and is Sufficient for IEEE 802.3ba Systems", IEEE 802.3ba Interim, Jan. 2008, 8 pages.

Ilango Ganga, "40/100G Architecture & Interfaces proposal", IEEE 802.3ba Interim meeting, Portland, OR, Jan. 23, 2008, 9 pages.

Chris Cole, "Nx10G Electrical I/O Issues", IEEE 802.3 Higher Speed Study Group, Finisar, Nov. 12-15, 2007, 13 pages.

"Part 3: Carrier Sense Multiple Access with Collision Detection (CSMA/CD) Access Method and Physical Layer Specifications", Draft Amendment to IEEE Std 802.3-2008 IEEE 802.3ba 40Gb/s and 100Gb/s Ethernet Task Force, Draft Standard for Information technology—Telecommunications and information exchange between systems—Local and metropolitan area networks—Specific requirements, IEEE P802.3ba™/D1.1, Dec. 9, 2008, 366 pages.

"Part 3: Carrier Sense Multiple Access with Collision Detection (CSMA/CD) Access Method and Physical Layer Specifications", Amendment 4: Ethernet Operation over Electrical Backplanes, IEEE Standard for Information technology—Telecommunications and information exchange between systems—Local and metropolitan area networks—Specific requirements, IEEE Std 802.3ap™, May 22, 2007, 203 pages.

Office Action Received for Japanese Patent Application No. 2007-504035, mailed on May 12, 2009, 4 pages, including 2 pages of English translation.

International Search Report for PCT Patent Application No. PCT/US 2003/034160, mailed on Jul. 27, 2010, 8 pages.

International Preliminary Report on Patentability issued in PCT Patent Application No. PCT/US2005/008607, mailed on Sep. 28, 2006, 9 pages.

Chinese Office Action received for Chinese Patent Application No. 200580005349.3, maied on Mar. 14, 2008, 30 pages, including 18 pages of English translation.

International Search Report and Written Opinion issued in PCT Patent Application No. PCT/US 2005/008607, Jun. 10, 2010, 14 pages.

Baek et al., "Increased Radiation Emission and Impedance Change by Edge Placement of High-Speed Differential Lines on Printed Circuit Board", IEEE International Symposium on Electromagnetic Compatibility, Aug. 19, 2002, pp. 200-204.

Lund et al., "Going Serial in Gigabit Ethernet Designs". Broadcom Corp., Comms Design. Com dated Jun. 20, 2002. Retrived from the http://www.commsdesign.com/story/OEG2002,0620S0004, 7 pages.

Office Action Received for Taiwanese Patent Application No. 092131067, mailed Dec. 17, 2004, 3 pages, including 1 page of English translation.

Office Action for European Patent Application No. 03779361.9, mailed Nov. 6, 2007, 9 pages.

Notice of Allowance Received for Taiwan Patent Application No. 09231067, mailed May 9, 2005, 5 pages, including 3 pages of English translation.

Office Action Received for U.S. Appl. No. 12/381,205, mailed on Feb. 24, 2012, 8 pages.

Office Action Received for U.S. Appl. No. 12/381,282, mailed on Sep. 30, 2011, 14 pages.

NN9207223, "High Speed Bus", IBM Technical Disclosure Bulletin, vol. 35, Issue 2, Jul. 1992, pp. 223-224.

Notice of Allowance and Reasons for Allowance received in U.S. Appl. No. 12/381,205, mailed Jul. 11, 2012, 14 pages.

* cited by examiner

FIG. 1

| MDIO variable | PMA/PMD register name | Register/bit number | FEC variable |
|---|---|---|---|
| 10GBASE-R FEC ability | 10GBASE-R FEC ability register | 1.170.0 | FEC_ability |
| 10GBASE-R FEC Error Indication ability | 10GBASE-R FEC ability register | 1.170.1 | FEC_Error_Indication_ability |
| FEC Enable | 10GBASE-R FEC control register | 1.171.0 | FEC_Enable |
| FEC Enable Error Indication | 10GBASE-R FEC control register | 1.171.1 | FEC_Enable_Error to PCS |
| FEC corrected blocks | 10GBASE-R FEC corrected blocks counter register | 1.172, 1.173 | FEC_corrected_blocks_counter |
| FEC uncorrected blocks | 10GBASE-R FEC uncorrected blocks counter register | 1.174, 1.175 | FEC_uncorrected_blocks_counter |

CABLE INTERCONNECTION TECHNIQUES

RELATED APPLICATION

This application is related to U.S. patent application Ser. No. 12/381,205, entitled "Interconnection Techniques," filed Mar. 9, 2009, inventors Ganga and Mellitz and incorporates by reference the contents of that application in its entirety.

FIELD

The subject matter disclosed herein relates generally to techniques to provide communication between devices using cable interconnects.

RELATED ART

Cables are used as physical media to connect network devices. A PHY connects a physical medium to a link layer device such as a MAC. Ethernet is a common standard used for communication over cables. For example, IEEE Std 802.3ae-2002 defines 10 GBASE-R for transmission over optical fiber cable. Evolving data transmission speeds are increasing the data transmission needs over cable. IEEE 802.3ba is an emerging Ethernet standard for specifying speeds of 40 Gb/s and 100 Gb/s over different physical medium including backplane, copper, and optical fiber. What are needed are techniques for Ethernet operation over cable at the evolving speeds.

BRIEF DESCRIPTION OF THE DRAWINGS

Embodiments of the present invention are illustrated by way of example, and not by way of limitation, in the drawings and in which like reference numerals refer to similar elements.

DETAILED DESCRIPTION

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Various authors have expressed that use of multiple cables to increase the rate of data transmission may incur cross talk among signals on the cables and lead to unacceptable performance. For example, slide 10 of Cole, "N×10 G Electrical I/O Issues," IEEE 802.3 Higher Speed Study Group (November 2007) indicates that cross talk from adjacent conductors, traces, and connectors may lead to unacceptable performance. However, embodiments described herein may exhibit acceptable bit error rates when IEEE 802.3ap (2007) is applied across multiple conductors.

Figure 1:
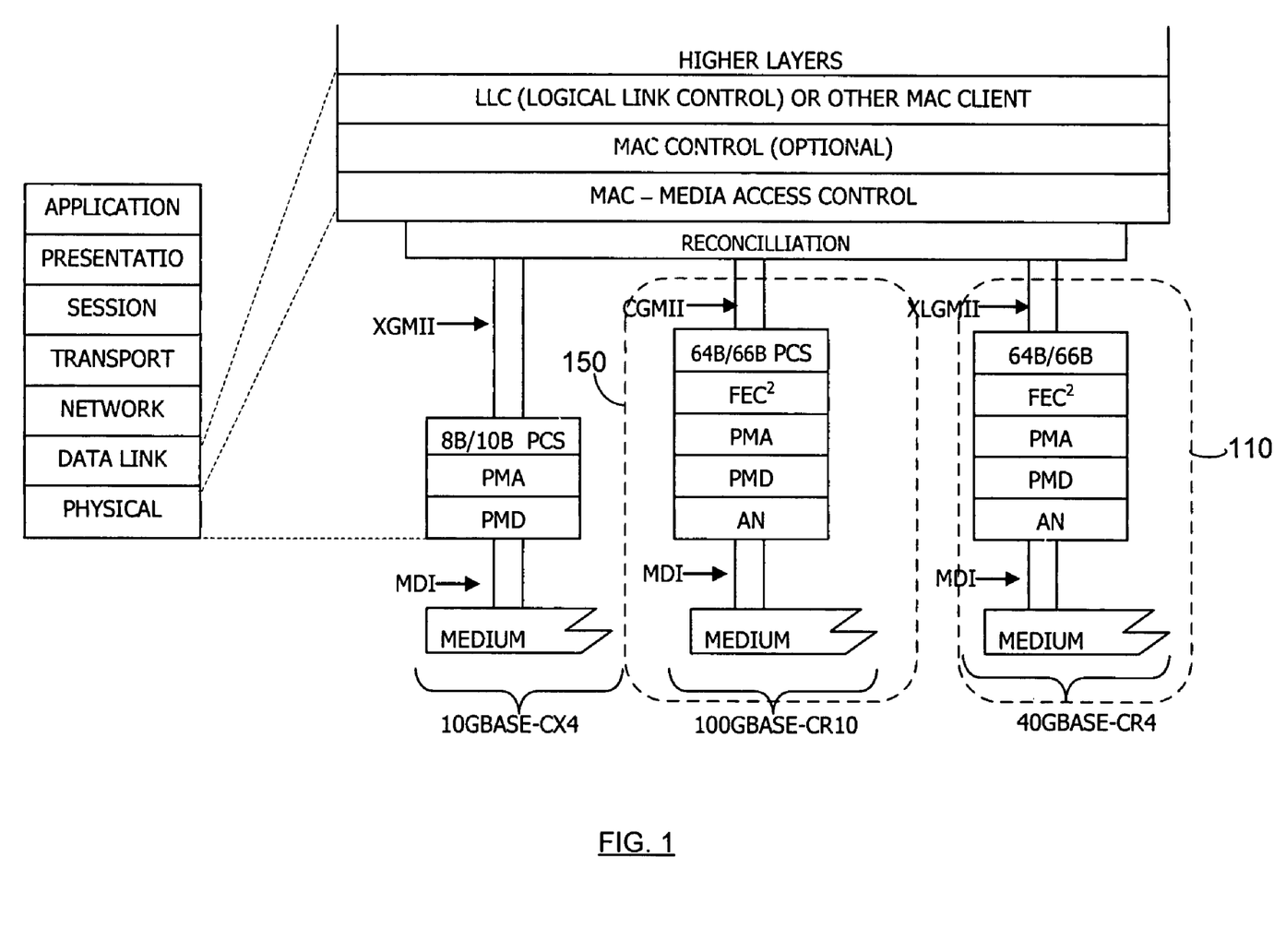
FIG. 1 provides a layer diagram and architecture for PHY stacks capable of signal processing at various speeds, in accordance with an embodiment.

FIG. 1 provides a layer diagram and architecture for PHY stacks capable of signal processing at various speeds, in accordance with an embodiment. PHY stack 110 provides the capability to transmit and receive data over a copper cable each at 40 Gb/s whereas PHY stack 150 provides the capability to transmit and receive data over a copper cable at 100 Gb/s. In some embodiments, PHY stack 110 provides operation in accordance with 40 GBASE-CR4 whereas stack 150 provides operation in accordance with 100 GBASE-CR10, which are both described in the emerging IEEE 802.3ba standard. In this example, a 40 Gigabit Media Independent Interface (XLGMII) interface provides interconnection between PHY stack 110 and a media access control (MAC) layer. A 100 Gigabit Media Independent Interface (CGMII) interface provides interconnection between PHY stack 150 and the media access control layer.

Clause 73 of IEEE 802.3ap-2007 specifies auto-negotiation for backplane and clause 74 of IEEE 802.3ap-2007 specifies forward error correction for backplane. Various embodiments of PHYs 110 and 150 include forward error correction (FEC) sublayers that support forward error correction for cable by complying with clause 74 of IEEE 802.3ap-2007. In addition, various embodiments of PHYs 110 and 150 include Auto-Negotiation (AN) sublayers to negotiate FEC ability in compliance with clause 73 of IEEE 802.3ap-2007. In addition, AN sublayers allow backward compatibility with 10 GBASE-CX4 systems.

In some embodiments, stacks 110 and 150 may encode and decode traffic transmitted over virtual lanes in accordance with techniques described in "100 GE and 40 GE PCS (MLD) Proposal," IEEE 802.ba (May 2008). PMA sublayers may convert physical lanes into virtual lanes and vice versa. As used herein, a lane may refer to an interconnection between two full duplex transceivers using a physical media such as a cable or backplane. For example, twin-axial coaxial cables can be used as a physical media. Cables with metal conductors other than copper can be used (e.g., any alloy such as but not limited to silver or platinum). Optical single and multi-mode cables can be used. Optical cables can be used in active cable assemblies. Active means there are electrical to optical converters in the cable assembly at each end.

For 40 Gbps operation, four physical lanes and four virtual lanes may be used. For 100 Gbps operation, ten physical lanes and twenty virtual lanes may be used. Other configurations of physical lanes are also possible. For example, 40 Gbps may use 2 physical lanes (2 lanes, each lane at 20 Gbps) or 1 physical lane (1 lane at 40 Gbps serial). Similarly, other physical lanes are possible for 100 Gbps. For example, four physical lanes (4 lanes, each lane at 25 Gbps) or 2 physical lanes (2 lanes, each lane at 50 Gbps). The FEC operates on a virtual lane basis which may remain as 4 virtual lanes for 40 G and 20 virtual lanes for 100 G.

To perform forward error correction, some embodiments of FEC sublayers may comply with techniques described in Szczepanek et al., "10 GBASE-KR FEC Tutorial," submitted to IEEE802 Plenary (July 2006). FEC sublayers may use a shortened cyclic code (2112, 2080) for error checking and forward error correction described in patent application Ser. No. 11/325,765, entitled "Techniques to Perform Forward Error Correction for an Electrical Backplane," filed Jan. 4, 2006 with the following modifications. For 40 Gbps transmission, the FEC encoding and decoding is performed on a per lane basis on all the four virtual lanes. For 100 Gbps transmission, the FEC encoding and decoding is performed on a per lane basis on all the twenty virtual lanes. The 64B/66B encoded data on each lane is passed to the FEC encoding functions which then converts to (2112, 2080) code blocks. The FEC code blocks are then serialized on each of the PMA or PMD lanes downstream. Burst errors up to 11 bits may be correctable.

In various embodiments, FEC sublayers of stacks 110 and 150 use the FEC block lock for a received data stream described with regard to FIG. 74-8 of IEEE 802.3ap-2007 for each virtual lane. The Report Global Sync achieved for a link is reported if all lanes are locked. Out of sync is reported if any lane is not locked.

FEC sublayers may perform data alignment for data transmitted over the physical lanes. Data transmitted over multiple lanes might suffer different delays on each lane. Accordingly, four bits (e.g., bit0, bit1, bit2, and bit3) transmitted over four different lanes may arrive at different instances in time at the receiver. FEC frame markers can be used for signals transmitted on each of the lanes. The FEC frame markers can be used to align data transmitted on different lanes so that data on all lanes are available for processing at the same time. The FEC frame marker can be a Word 0 (T0), the start of an FEC block, shown in Table 74-1 of IEEE 802.3ap-2007.

In some embodiments, the FEC Error indication is made by indicating error through sync bits to the PCS layer. In clause 74.7.4.5.1 of IEEE 802.3ap (2007), the error was indicated by marking every eighth 64B/66B block sync bits (e.g., bits 1, 9, 17, 25, and 32) in an FEC block (or FEC frame). The error was not indicated in each 64B/66B block sync bits because this may cause the PCS to go out of sync even during low error conditions. This method will work with a single lane case, as in 10 GBASE-KR, however the same technique will not work if it is applied to a multi lane case as in 40 GBASE-R or 100 GBASE-R.

For a 40 Gb/s case, 64B/66B data is distributed over multiple lanes (e.g., four lanes), at least every alternate 64B/66B block sync bits are marked with error (e.g., bits 1, 3, 5, 7, and so on) on each FEC lane going to the PCS.

For 100 Gb/s case, all 64B/66B block sync bits are marked with error because it is distributed over 20 virtual lanes. Note that for a 40 Gb/s case, for all lanes, marking all 64B/66B sync bits in an FEC block can occur as well. This technique is unique to multilane operation of FEC. The multilane marking cannot be used with single lane 10 Gb/s case because the marking each 64B/66B will cause the 10 G PCS to go out of sync and will significantly magnify the actual error condition on the wire. Accordingly, single lane FEC error indication as defined in clause 74 in 802.3ap (2007) does not work in a multi-lane operation. When PCS blocks are distributed over multiple lanes (4 or 20 lanes), the error marking also gets distributed over multiple lanes and accordingly error marking density needs to be increased when 10 GBASE-KR FEC is used with 40 Gbps and 100 Gbps. For 40 Gbps, a minimum of every other location is to be marked with error and for 100 Gbps, every location is to be marked with error.

Figure 2:
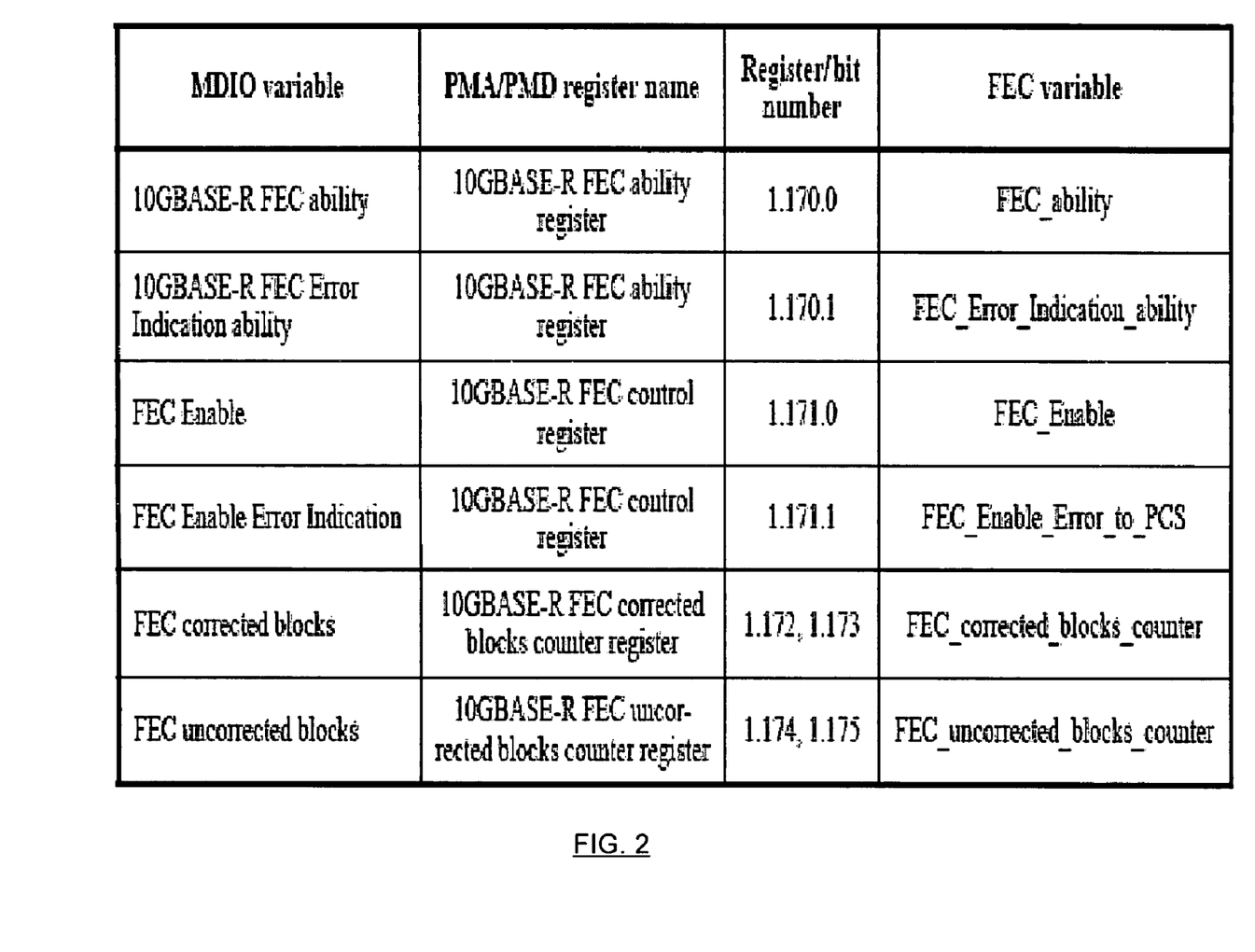
FIG. 2 depicts a management register format that may be used to count FEC uncorrected blocks and corrected blocks, in accordance with an embodiment.

FIG. 2 depicts a management register format that may be used to count FEC uncorrected blocks and corrected blocks, in accordance with an embodiment. Variables FEC_uncorrected_blocks_counter and FEC_corrected_blocks_counter are used to count uncorrected blocks and corrected blocks for each virtual lane. For 40 Gb/s there are 4 sets of counters and for 100 Gb/s there are 20 sets of counters and corresponding registers. In some embodiments, indexed addressing can be used to conserve MDIO address space. For example, an index value can be accessed and the index value refers to an address space associated with counters for each lane.

Auto-negotiation (AN) sublayers of PHY stacks 110 and 150 may use auto-negotiation techniques described in clause 73 of IEEE 802.3ap-2007 even though cable is used to transmit signals. Auto-negotiation may run on a single lane to negotiate FEC capability. Auto-Negotiation is run on one of the physical lanes coupled to the MDI. For example, lane 0 of the MDI may be used for Auto-Negotiation, of single or multi-lane PHYs. FEC is enabled when both sides advertise FEC ability and at least one side requests to enable FEC. After negotiated on a single lane, the selected FEC may be enabled on all lanes.

Auto-Negotiation uses DME signaling with 48-bit base pages to exchange link partner abilities. An AN base page may include: Technology Ability field to indicate PHY types, FEC capability, Pause ability, and Remote fault. The AN base page may be modified so that the Technology Ability bits from the reserved space indicate 40 GBASE-CR4 ability and 100 GBASE-CR10 ability. The following table depicts the technology ability field coding.

| Bit | Technology |
| --- | --- |
| A0 | 1000BASE-KX |
| A1 | 10GBASE-KX4 |
| A2 | 10GBASE-KR |
| A3 | 40GBASE-KR4 |
| A4 | 40GBASE-CR4 |
| A5 | 100GBASE-CR10 |
| A6-A24 | Reserved |

For example, bits A4 and A5 can be used to respectively advertise 40 GBASE-CR4 ability and 100 GBASE-CR10 ability for copper communication.

Clause 73 describes a parallel detection technique for compatibility with legacy PHYs that do not support Auto-Negotiation. For example, a 40 GBASE-CR4 PHY can use parallel detection for auto-detection of legacy 10 GBASE-CX4 devices. For example, when used with a CX4 style connector, a 40 GBASE-CR4 PHY allows backward compatibility with legacy 10 G connectors. Accordingly, dual speed 10/40 Gbps systems can be achieved. In addition, auto-negotiation could permit forward compatibility of 40 Gbps PHY with a 100 G PHY. For example, a 40 G and 100 G may share the same connector solution.

Other uses of auto-negotiation can include permitting digital signal detect, negotiate pause ability, and allowing link partners to startup with a known state.

Figure 3:
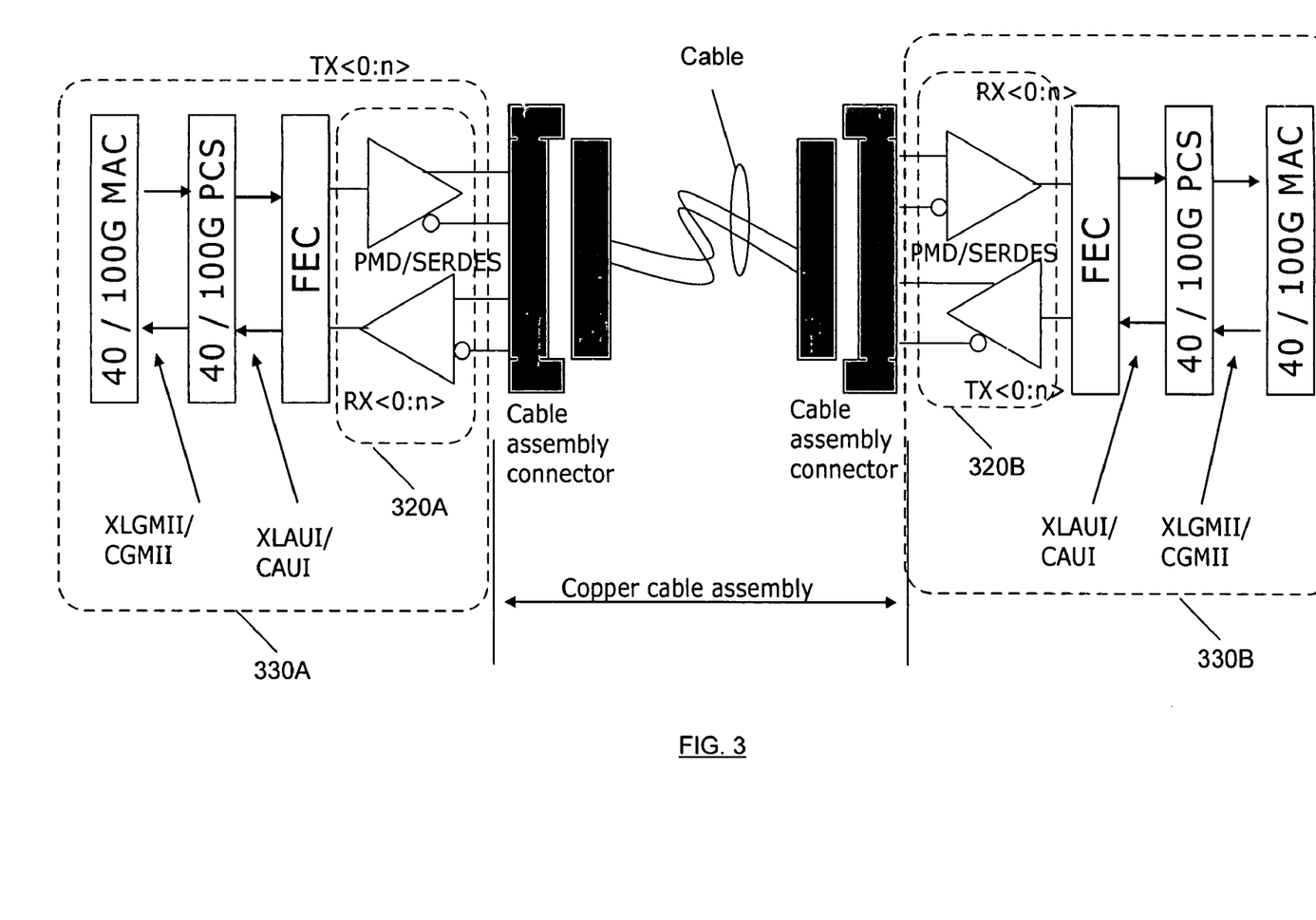
FIG. 3 depicts an example of a single lane transceiver pair, in accordance with an embodiment.

FIG. 3 depicts an example of a single lane transceiver pair, in accordance with an embodiment. Transceiver 330A and transceiver 330B form a pairs of transceivers that are communicatively coupled using the copper cable assembly. Connectors described in clause 85 of IEEE 802.3ba draft 1.2

(2009) can be used for connection to cables. For 40 Gb/s transmission, four transceiver pair are communicatively coupled using the copper cable assembly. In this example, for 40 Gb/s operation, a MAC is communicatively coupled to a PCS using an XLGMII interface and the PCS is communicatively coupled to the FEC using an XLAUI interface. In this example, for 100 Gb/s operation, a MAC is communicatively coupled to a PCS using a CGMII interface and the PCS is communicatively coupled to the FEC using a CAUI interface. In other examples, the transceiver are implemented using a single chip and no interfaces are used.

The copper cable assembly couples PMD/SERDES 320A to PMD/SERDES 320B. Each lane includes a transmit conductor pair and receive conductor pair. For 40 Gbps transmission, copper assembly cable uses four pairs of conductors for transmit and four pairs of conductors for receive. For 100 Gbps transmission, copper assembly cable uses ten pairs of conductors for transmit and ten pairs of conductors for receive. PMD/SERDES 320A transmits differential signals via a pair of conductors to PMD/SERDES 320B. PMD/SERDES 320A receives differential signals via a pair of conductors from PMD/SERDES 320B.

Figure 4:
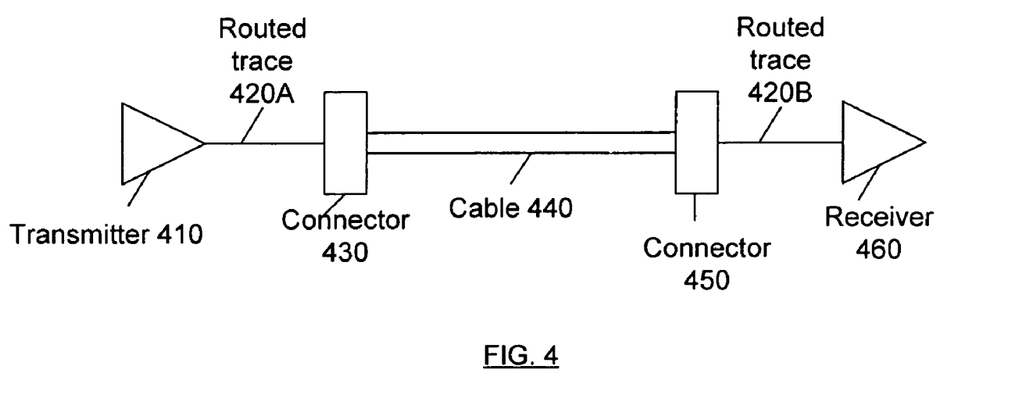
FIG. 4 depicts an implementation of a routed trace coupling a transmitter to a cable connector and a second routed trace coupling a cable connector to a receiver.

FIG. 4 depicts an implementation of a routed trace coupling a transmitter to a cable connector and a second routed trace coupling a cable connector to a receiver. Cable 440 communicatively couples connector 430 to connector 450. Routed trace 420A communicatively couples transmitter 410 to connector 430 and routed trace 420B communicatively couples connector 450 to receiver 460. Routed trace 420A is formed on a printed circuit board (not depicted). Similarly, routed trace 420B is formed on a printed circuit board (not depicted). In one example, printed circuit boards are a Nelco 4000 13 Si material and trace 420A is 3 inches whereas routed trace 420B is 5 inches. In another example, printed circuit boards are a Megtron6 material and trace 420A is 4 inches whereas routed trace 420B is 12 inches. A printed circuit board with a lower loss tangent permits a longer routed trace.

Figure 5:
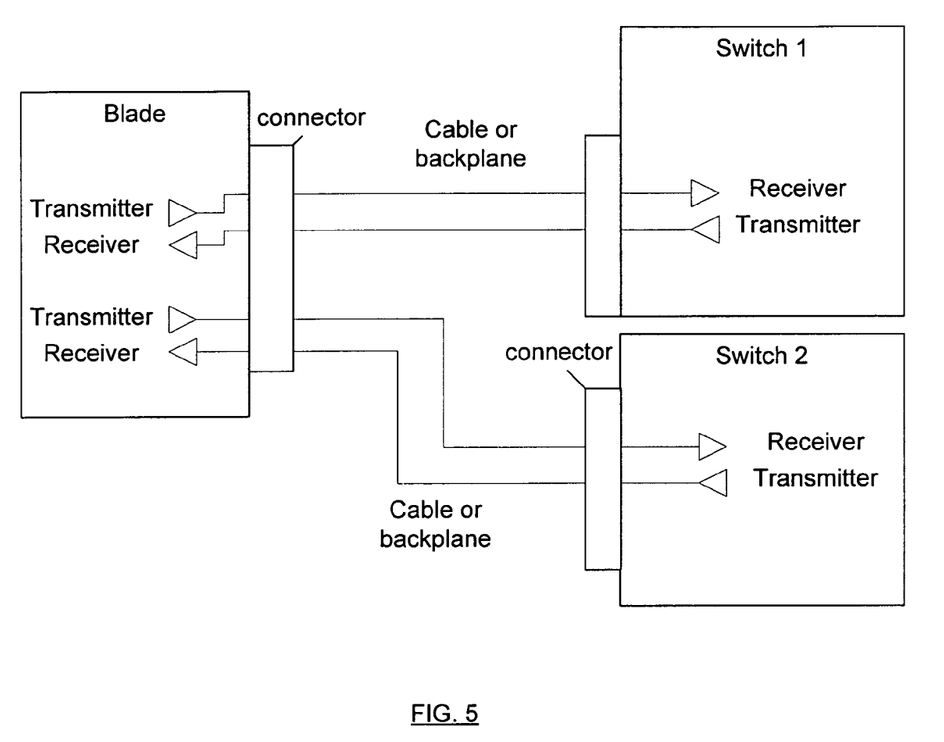
FIG. 5 depicts a system in which cables interconnect a blade with multiple switches.

FIG. 5 depicts a system in which cables interconnect a blade with multiple switches, in accordance with some embodiments. For example, the blade may operate communicate at 40 Gbps with switch 1 and at 40 Gbps with switch 2.

In some embodiments, a receiver adjusts the finite impulse response filter settings of an equalizer of a complementary transmitter. For example, a receiver may adjust the equalization applied by a complementary transmitter using a control channel described with regard to the 10 GBASE-KR PMD control function as defined in clause 72.6.10 of IEEE Std 802.3ap-2007. Establishing equalizer settings may take place after auto-negotiation successfully completes in order for the receiver to know the number of transmit-receive pairs for each lane.

Figure 6:
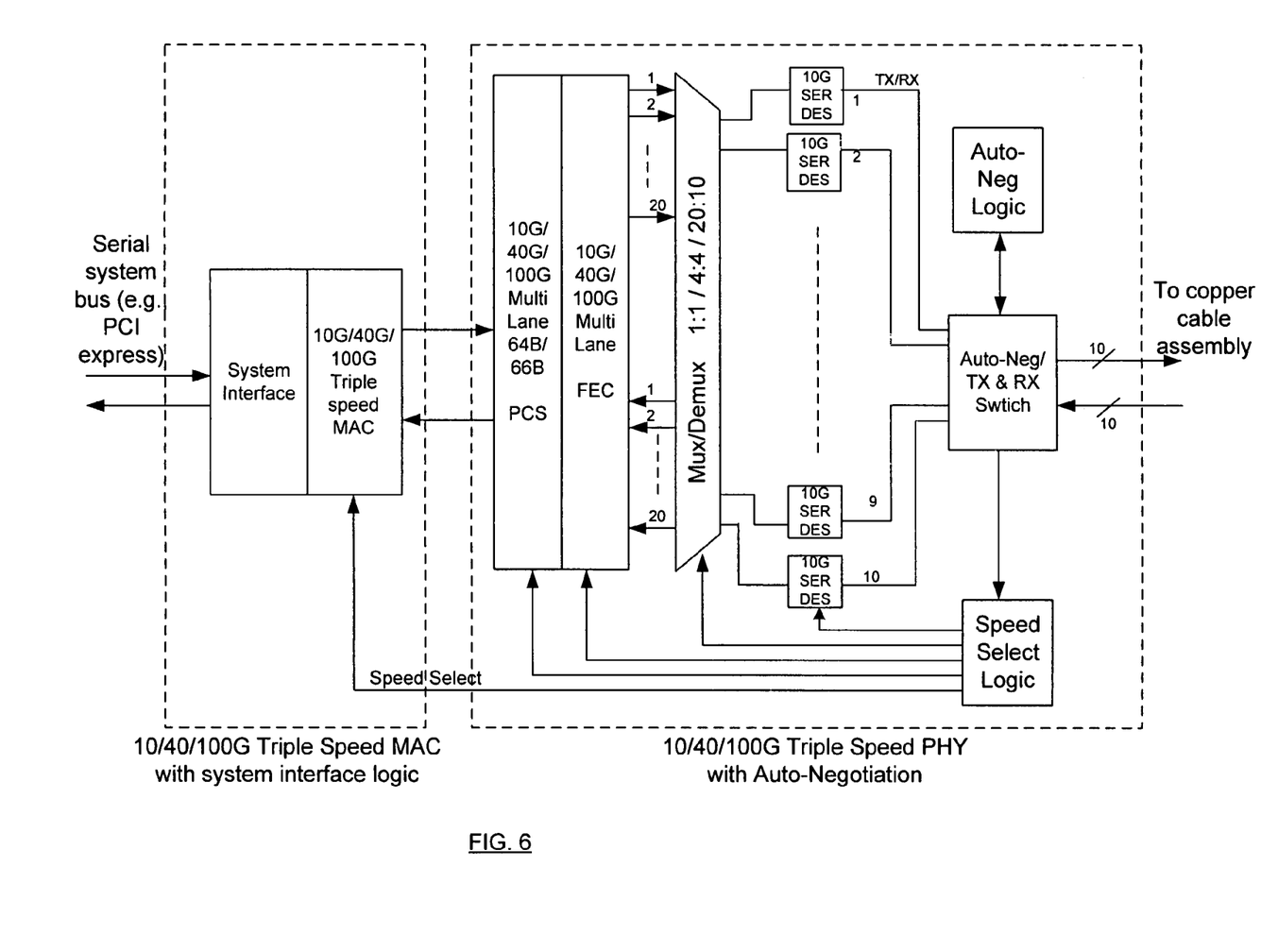
FIG. 6 depicts a triple speed MAC/PHY implementation, in accordance with some embodiments.

FIG. 6 depicts a triple speed MAC/PHY implementation, in accordance with some embodiments. In this implementation a single MAC is shown to operate and 3 speeds 10 Gb/s, 40 Gb/s, or 100 Gb/s. The speed of the MAC can be selected using a speed select signal coming from a speed select logic. The speed select logic controls the operation of the MAC speed and also it controls the clock scaling function to the MAC (selection of appropriate clock rate for the MAC to operate).

The MAC connects to the PHY block using a 64-bit wide (in each of transmit and receive direction) intra chip interconnect. While operating in 40 Gb/s the interconnect is configured to operate with XLGMII mode and while operating at 100 Gb/s operation the interconnect is configured to operate in CGMII mode. However, while operating in the 10 Gb/s operation the XGMII signals which are 32-bit wide are mapped to 64 bit bus by means of word interleaving. This means the first word is packed in the first 32-bits of the 64 bit bus and the second word is packed in the second 32-bit of the 64 bit bus. In other implementations it is possible to just drive the first 32 bit of the bus and leave the second 32 bits of the 64 bit bus disabled. The speed select logic configures this interconnect appropriately for proper speed of operation.

The PCS function inside the PHY block is a 64B/66B multi-lane PCS that can operate up to a maximum of 20 lane operation. However, the PCS also supports a mode to operate with 4 lane for 40 Gb/s operation and 1 lane for 10 Gb/s operation. For the case of 10 Gb/s operation the PCS follows the clause 49 of the PCS specification of IEEE 802.3ae-2002. The PCS disables the physical to logical lane mapping functions that is otherwise required for 40 G and 100 G operation. This allows the same PCS function to be used for 3 speeds 10 G/40 G and 100 G operation. The speed select logic provides appropriate signals to select the configuration of the PCS block.

The FEC block is a multi-lane FEC function that can operate from 1 lane to up to 20 lanes of operation. The PCS layer provides a bit serial interface per logical lane to directly connect to the FEC function within the PHY. During 10 Gb/s operation only one of the bit serial lanes is active and other lanes are disabled. The multilane FEC is configured to operate with just a single lane for 10 Gb/s. Whereas in the case of 40 Gb/s operation, four lanes are enabled and other lanes are disabled. In the case of 100 Gb/s operation all 20 lanes of the FEC functions are enabled. The speed select logic configures the FEC functional block appropriately. For 100 Gbps operation, the FEC function operates at a rate of 5.15625 Gbps for each lane, whereas for 10 and 40 Gbps operation, the FEC function operates at the rate of 10.3125 Gbps.

Because the FEC block operates on logical lanes, there is a MUX function employed that allows connectivity to SERDES. The mux function can be configured to operate either in 1:1 or 4:4 or 20:10 multiplexing or demultiplexing mode. The speed select logic provides signal to control the mux appropriately. The 1:1 multiplexing is used for 10 Gb/s operation. The 4:4 multiplexing is used for 40 Gb/s operation. For 100 Gb/s operation, 20:10 mode is enabled.

The triple speed PHY has 10 lane SERDES functions that are connected to the MUX at input of the SERDES and the output of the SERDES connect to a switch function. This switch function is used to couple the medium to appropriate logic or PHY. During the link configuration this allows passing the AN signaling to the medium. Once the link is configured the AN logic communicates to the Speed select logic of the appropriate speed. This speed select logic then configures the rest of PHY and MAC to operate at the speed provided by the AN function. Then the Switch function connects to either the first serdes only for 10 Gb/s operation or to first four SERDES (1 . . . 4) for 40 Gb/s operation or to all 10 SERDES (1 . . . 10) for 100 Gb/s operation. The speed select logic also disables the other SERDES functions that are not used. This drives electrical idle on the unused lanes. Similarly, the receive function of SERDES ignores any signal received on the unused lanes.

Some embodiments provide proposed modifications to Clause 74 FEC of IEEE 802.3ap (2007) for multilane bit serial operation with 40 GBASE-R and 100 GBASE-R PHYs. Modifications address comment #351 on P802.3ba-D1.1.

Clause 74 FEC functional interfaces were originally defined for use with 10 GBASE-R PHYs. The 10 GBASE-R FEC service interface uses 16-bit XSBI interface as specified in clause 74.5. The FEC function operates on 64B/66B data code blocks. Hence, a reverse gearbox function defined in clause 74.7.4.1 provides functionality to adapt between the 66-bit width of the 64B/66B blocks and the 16-bit width of the FEC service interface.

In some embodiments, the reverse gearbox functionality is modified to adapt the 66-bit width of 64B/66B blocks to the multilane bit serial 40/100 GBASE-R FEC service interface or its physical instantiation of XLAUI/CAUI. Changes are suggested for the following clauses: clause 74.7.4.1 Reverse gearbox function; clause 74.7.4.3 transmission bit ordering (FIG. 74-3), clause 74.7.4.4 FEC encoding, FIG. 74-4; clause 74.7.4.5.1 FEC decoding, FIG. 74-6; clause 74.7.4.6 FEC receive bit ordering, FIG. 74-7; and clause 74.6 Delay constraints to adjust the value for 40 Gbps and 100 Gbps bit time.

Changes to clause 74.7.4.1 are as follows. The reverse gearbox function adapts between the 66-bit width of the 64B/66B blocks and the 1-bit wide lane of the 40 GBASE-R or 100 GBASE-R PCS to FEC interface. It receives the 1-bit stream from the FEC service interface and converts them back to 66-bit encoded blocks for the FEC Encoder to process. The reverse gearbox function operates in the same manner as the lane block sync function defined in 82.2.11.

The reverse gearbox function receives data via 40 GBASE-R and 100 GBASE-R FEC_UNITDATA.requestx primitive (see 74.5.2). It obtains lock to the 66-bit blocks in each bit stream using the sync headers and outputs 66-bit blocks to the FEC encoder function (see 74.7.4.4). PCS lane lock is obtained as specified in the PCS lane lock state diagram shown in FIG. 82-10.

The reverse gearbox functionality may be used when the physical instantiation of FEC service interface XLAUI/CAUI is implemented between the PCS and FEC functions because that interface passes data via bit serial 4 or 10 lanes. When the XLAUI/CAUI is not implemented, the internal data-path width between the PCS and FEC is an implementation choice. Depending on the path width, the reverse gearbox function may not be necessary.

Figure 7:
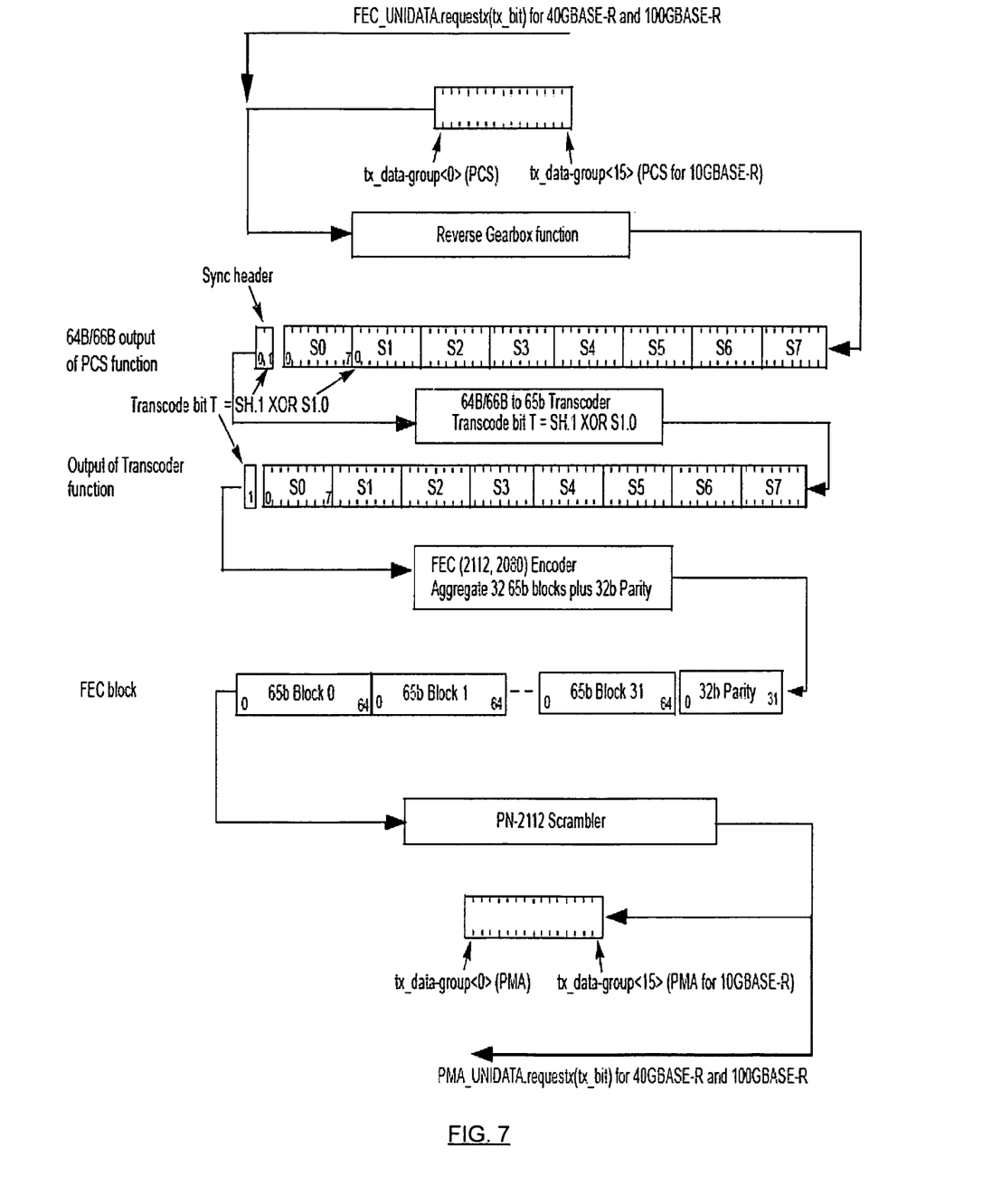
FIG. 7 depicts a replacement to FIG. 74-3—FEC Transmit Bit Ordering of clause 74.7.4.3, in accordance with an embodiment.

FIG. 7 depicts a replacement to FIG. 74-3—FEC Transmit Bit Ordering of clause 74.7.4.3, in accordance with an embodiment.

Figure 8:
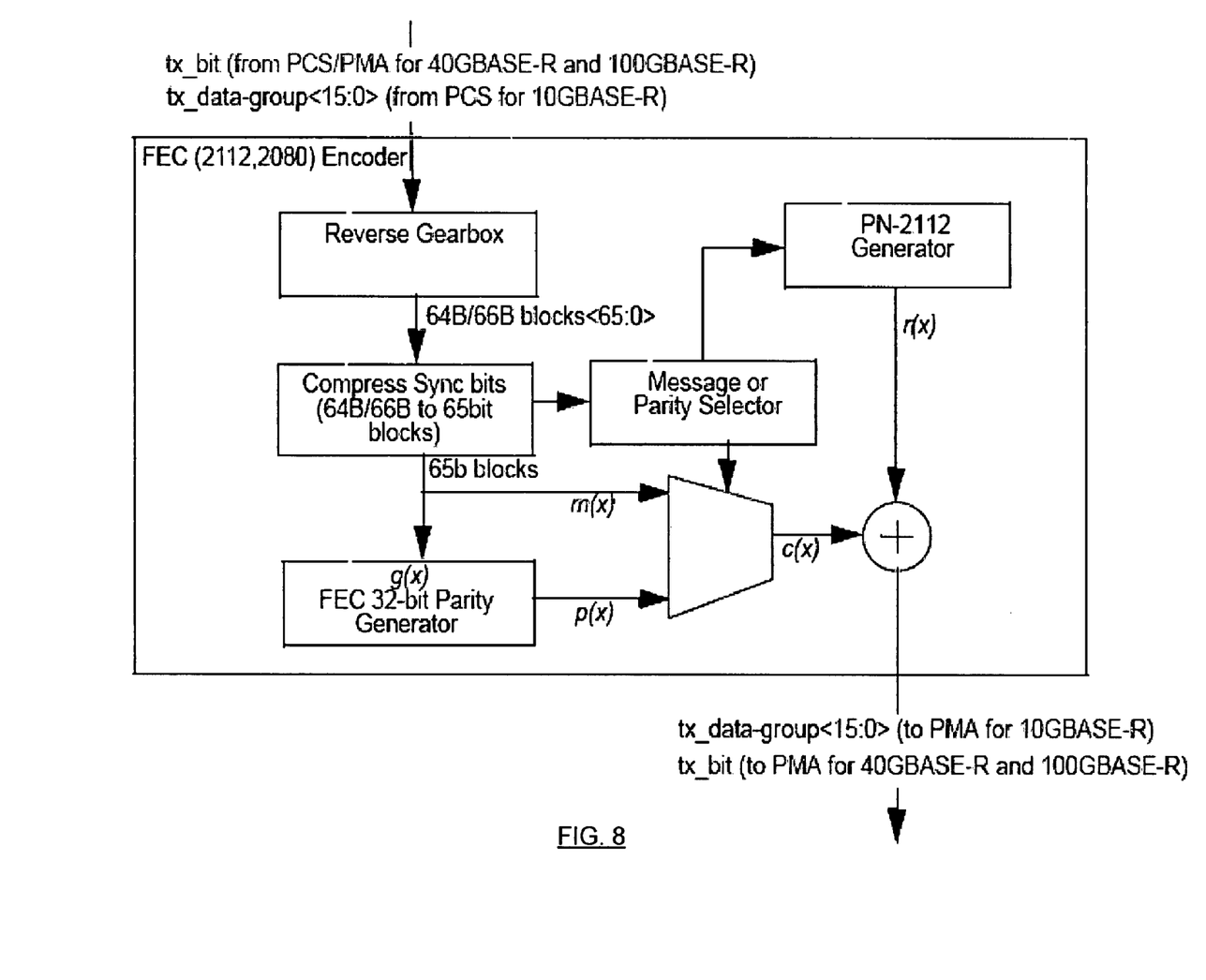
FIG. 8 depicts a replacement to FIG. 74-4—FEC (2112, 2080) encoding of clause 74.7.4.4, in accordance with an embodiment.

FIG. 8 depicts a replacement to FIG. 74-4—FEC (2112, 2080) encoding of clause 74.7.4.4, in accordance with an embodiment.

Figure 9:
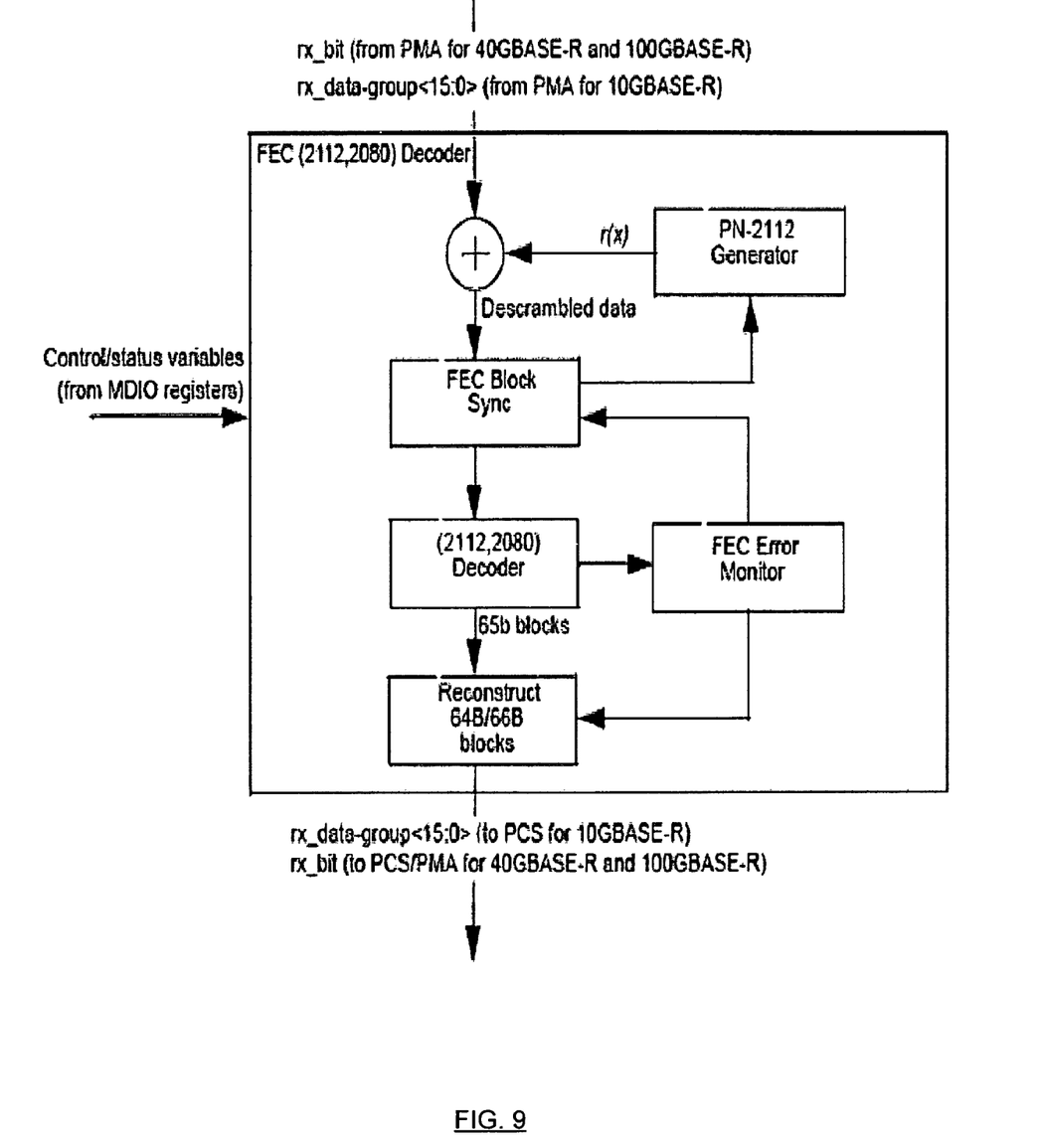
FIG. 9 depicts a replacement to FIG. 74-6—FEC (2112, 2080) decoding of clause 74.7.4.5.1, in accordance with an embodiment.

FIG. 9 depicts a replacement to FIG. 74-6—FEC (2112, 2080) decoding of clause 74.7.4.5.1, in accordance with an embodiment.

Figure 10:
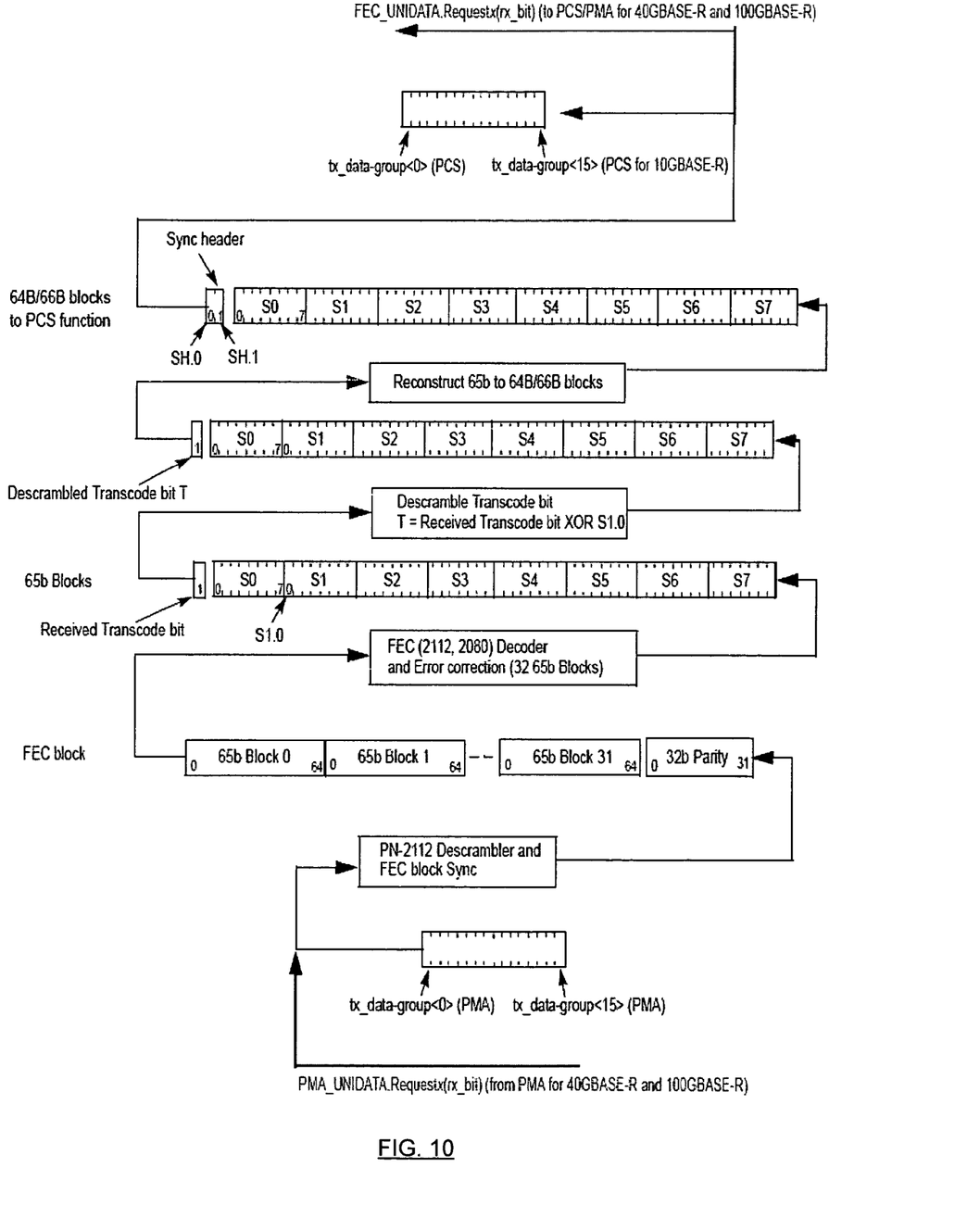
FIG. 10 depicts a replacement to FIG. 74-7—FEC Receive bit ordering of clause 74.7.4.6, in accordance with an embodiment.

FIG. 10 depicts a replacement to FIG. 74-7—FEC Receive bit ordering of clause 74.7.4.6, in accordance with an embodiment.

In some embodiments, clause 74.6 is modified so that the sum of transmit and receive delay contributed by the 40 GBASE-R FEC shall be no more than 24576 BT and the sum of transmit and receive delay contributed by the 100 GBASE-R FEC shall be no more than 61440×2 BT.

Embodiments of the present invention may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments of the present invention. A machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

The drawings and the forgoing description gave examples of the present invention. Although depicted as a number of disparate functional items, those skilled in the art will appreciate that one or more of such elements may well be combined into single functional elements. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A computer-implemented method, the method comprising:
    identifying a start position of a Forward Error Correction (FEC) block received from a lane as Word 0 of the FEC block based at least on parity bits of the FEC block;
    performing data alignment for data transmitted over different lanes, wherein performing data alignment comprises detecting FEC frame markers and wherein each FEC frame marker comprises Word 0 that is also used to identify a start position of the FEC block, and
    reporting Global Sync for a link in response to alignment of data on all lanes.

2. The method of claim 1, further comprising:
    performing FEC decoding based at least in part on signals received from a lane.

3. The method of claim 1, further comprising:
    receiving multiple signals transmitted over the different lanes;
    performing FEC decoding based at least in part on a signal received from a lane of the different lanes; and
    performing FEC decoding based at least in part on a signal received from another lane of the different lanes.

4. The method of claim 3, further comprising:
    indicating FEC error through at least every alternate sync bit.

5. An apparatus comprising:
    a data alignment device configured to:
        identify a start position of an FEC block received from a lane as Word 0 of the FEC block based at least on parity bits of the FEC block and also to perform data alignment for data transmitted over different lanes, wherein to detect FEC frame markers, the data alignment device is to perform data alignment for data transmitted over different lanes, wherein each FEC frame marker comprises Word 0 that is also used to identify a start position of the FEC block, and the data alignment device is to report Global Sync for a link in response to alignment of data on all lanes.

6. The apparatus of claim 5, further comprising:
    an FEC encoder and
    an FEC decoder, wherein:
        the FEC encoder logic is to encode content using (2112, 2080) code blocks independently for each of the lanes and the FEC decoder logic is to decode (2112, 2080) code blocks independently on each of the lanes and is to provide 64B/66B blocks.
7. The apparatus of claim 6, wherein the FEC decoder logic is to indicate error through sync bits.
8. The apparatus of claim 6, wherein
the FEC decoder logic is to indicate to the PCS sublayer logic errors in at least every alternate 64B/66B block sync bit.
9. The apparatus of claim 6, wherein:
each lane comprises a physical lane and each physical lane carries at least one virtual lane and
the FEC encoder and FEC decoder operate on each virtual lane independently.
10. An apparatus comprising:
a forward error correction (FEC) layer logic, the FEC layer logic comprising FEC encoder logic and FEC decoder logic;
a physical coding sublayer (PCS) sublayer logic;
logic to identify a start position of an FEC block received from a lane as Word 0 of the FEC block based at least on parity bits of the FEC block and also to perform data alignment for data transmitted over different lanes, wherein the logic is to detect FEC frame markers to perform data alignment for data transmitted over the different lanes, wherein each FEC frame marker comprises Word 0 that is also used to identify a start position of the FEC block, and the logic is to cause report of Global Sync for a link in response to alignment of data on all lanes, wherein
the PCS sublayer logic is to provide at least two lanes to the FEC encoder logic;
the PCS sublayer logic is to receive at least two lanes from the FEC decoder logic;
the FEC encoder logic is to encode content using (2112, 2080) code blocks on each of the lanes, wherein the FEC encoder logic is to encode content independently for each of the lanes,
the FEC decoder logic is to decode (2112, 2080) code blocks independently on each of the lanes and is to provide 64B/66B blocks,
the FEC decoder logic is to indicate error through sync bits to the PCS sublayer logic,
signals transmitted over the lanes are derived from a same signal source, and
an aggregate transmission rate of the signals transmitted over the lanes is approximately a number of lanes times a transmission rate of 10GBASE-KR in IEEE 802.3ap (2007).
11. The apparatus of claim 10, wherein:
each lane comprises a physical lane and each physical lane carries at least one virtual lane and
the FEC encoder and FEC decoder operate on each virtual lane independently.
12. The apparatus of claim 10, wherein
the FEC decoder logic is to indicate to the PCS sublayer logic errors in at least every alternate 64B/66B block sync bits.
13. The apparatus of claim 10 further comprising:
reverse gearbox logic configured to receive a 1-bit wide stream from the PCS sublayer logic and convert the stream to 66-bit wide 64B/66B blocks for the FEC encoder logic.
14. The apparatus of claim 10, wherein the FEC decoder logic is to provide 64B/66B blocks in a 1-bit wide stream to the PCS sublayer logic.
15. The apparatus of claim 10, further comprising:
logic to transmit a 48-bit auto-negotiation base page to a link partner, wherein the base page includes a Technology Ability field to indicate PHY types, FEC capability, Pause ability, and Remote fault, and Technology Ability bits in space A3 to indicate 40GBASE-KR4 ability.
16. The apparatus of claim 10, further comprising:
logic to transmit a 48-bit auto-negotiation base page to a link partner, wherein the base page includes a Technology Ability field to indicate PHY types, FEC capability, Pause ability, and Remote fault, and Technology Ability bits in space A4 to indicate 40GBASE-CR4 ability.
17. The apparatus of claim 10, further comprising:
logic to transmit a 48-bit auto-negotiation base page to a link partner, wherein the base page includes a Technology Ability field to indicate PHY types, FEC capability, Pause ability, and Remote fault, and Technology Ability bits in space A5 to indicate 100GBASE-CR10 ability.
18. The apparatus of claim 10, wherein:
a sum of transmit and receive delay contributed by the FEC layer logic is not more than 24576 BT.
19. The apparatus of claim 10, wherein:
a sum of transmit and receive delay contributed by the FEC layer logic is not more than 122880 BT.

* * * * *